United States Patent
Chida et al.

(10) Patent No.: US 10,326,379 B2
(45) Date of Patent: Jun. 18, 2019

(54) POWER CONVERSION DEVICE (71) Applicant: Hitachi Automotive Systems, Ltd., Hitachinaka-shi, Ibaraki (JP)

(72) Inventors: Tadahiko Chida, Tokyo (JP); Shintaro Tanaka, Tokyo (JP); Akihiro Goto, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/740,457

(22) PCT Filed: Jul. 1, 2016

(86) PCT No.: PCT/JP2016/069581
§ 371 (c)(1),
(2) Date: Dec. 28, 2017

(87) PCT Pub. No.: WO2017/006845
PCT Pub. Date: Jan. 12, 2017

(65) Prior Publication Data
US 2018/0191263 A1 Jul. 5, 2018

(30) Foreign Application Priority Data
Jul. 3, 2015 (JP) .................. 2015-134035

(51) Int. Cl.
*H02M 3/156* (2006.01)
*H02M 7/00* (2006.01)
*H02M 3/28* (2006.01)
*H02M 3/335* (2006.01)
(Continued)

(52) U.S. Cl.
CPC ............. *H02M 7/003* (2013.01); *H02M 3/28* (2013.01); *H02M 3/337* (2013.01);
(Continued)

(58) Field of Classification Search
CPC ... H02M 3/33569; H02M 3/156; H02M 7/003
See application file for complete search history.

(56) References Cited

U.S. PATENT DOCUMENTS

| 5,570,277 A * | 10/1996 | Ito ........................... H02M 1/32 363/19 |
| 7,403,397 B2 * | 7/2008 | Matsumoto ....... H02M 3/33538 361/792 |
| 2002/0047616 A1 * | 4/2002 | Yamaguchi ............. H01F 27/02 315/276 |
| 2005/0189566 A1 | 9/2005 | Matsumoto et al. |

FOREIGN PATENT DOCUMENTS

| JP | 11-214228 A | 8/1999 |
| JP | 2001-223491 A | 8/2001 |

(Continued)

OTHER PUBLICATIONS

International Search Report (PCT/ISA/210) issued in PCT Application No. PCT/JP2016/069581 dated Aug. 16, 2016 with English translation (Two (2) pages).
(Continued)

*Primary Examiner* — Jue Zhang
*Assistant Examiner* — Afework S Demisse
(74) *Attorney, Agent, or Firm* — Crowell & Moring LLP (57) ABSTRACT

Provided is a power conversion device which suppresses a current unbalance of a plurality of secondary circuit modules provided in parallel and is manufactured in a compact size and at a low cost. The power conversion device of the invention is a DC-DC converter which boosts down and outputs an input voltage, and includes an input circuit which includes a switching element and output circuit modules which include a transformer and a rectifier element. A plurality of the output circuit modules are provided. The plurality of output circuit modules are electrically connected to the input circuit.

6 Claims, 6 Drawing Sheets (51) Int. Cl.
*H05K 1/18* (2006.01)
*H05K 5/00* (2006.01)
*H02M 3/337* (2006.01)
*H05K 7/20* (2006.01)
*B60L 15/00* (2006.01)

(52) U.S. Cl.
CPC ........ *H02M 3/33569* (2013.01); *H05K 1/184* (2013.01); *H05K 5/0021* (2013.01); *B60L 15/007* (2013.01); *B60L 2210/30* (2013.01); *B60L 2210/40* (2013.01); *B60L 2240/525* (2013.01); *H05K 1/183* (2013.01); *H05K 7/20927* (2013.01); *H05K 2201/10015* (2013.01); *H05K 2201/10545* (2013.01)

(56) References Cited

FOREIGN PATENT DOCUMENTS

| | | |
|---|---|---|
| JP | 2001-286139 A | 10/2001 |
| JP | 2004-222486 A | 8/2004 |
| JP | 2005-143215 A | 6/2005 |

OTHER PUBLICATIONS

Japanese-language Written Opinion (PCT/ISA/237) issued in PCT Application No. PCT/JP2016/069581 dated Aug. 16, 2016 (Three (3) pages).

* cited by examiner

POWER CONVERSION DEVICE

TECHNICAL FIELD

The present invention relates to a DC-DC converter, and particularly to a DC-DC converter which is used in an electric vehicle and a plug-in hybrid vehicle.

BACKGROUND ART

An electric vehicle and a plug-in hybrid vehicle include an inverter device which drives a motor by a high voltage battery for a driving force and a low voltage battery which is used to operate auxiliaries such as lights, a radio, and the like of the vehicle. In such a vehicle, there is mounted a DC-DC converter which converts power from the high voltage battery to the low voltage battery or from the low voltage battery to the high voltage battery (for example, see PTL 1). In a housing of the DC-DC converter, a coolant channel is provided in a converter housing to cool down heated components therein, and a coolant such as a long-life coolant is supplied.

By the way, an output current required for the DC-DC converter for a vehicle reaches even 200 A. Therefore, heat amounts of the secondary winding and the secondary circuit of a transformer are large, and thus it is difficult to achieve a miniaturization and a low cost due to a countermeasure against the temperature rise. For example, as disclosed in PTL 2, there may be employed a configuration of a parallel DC-DC converter in which the secondary circuit is manufactured in a module type and provided in parallel to share the output current and to disperse the heat amount.

CITATION LIST

Patent Literature

PTL 1: JP 2005-143215 A
PTL 2: JP 2001-223491 A

SUMMARY OF INVENTION

Technical Problem

In the configuration disclosed in PTL 2, the secondary circuit modules are only provided in parallel, but the heat amount of the transformer itself is not able to be reduced. In addition, since there is generated a difference in wiring inductance from each of the secondary circuit modules to the transformer, the current is not able to be equally shared. Therefore, there is a need to design a sufficient margin for heat of the components used in the secondary circuit module, and there is a concern that an increase in size and the costs up are caused.

A primary object of the invention is to provide a power conversion device which suppresses a current unbalance of a plurality of secondary circuit modules provided in parallel, and is manufactured in a compact size and at a low cost.

Solution to Problem

A power conversion device according to the invention boosts downs and outputs an input voltage, and includes an input circuit module which includes a switching element, and an output circuit module which includes a transformer and a rectifier element. A plurality of the output circuit modules are provided to have almost the same structure. The plurality of output circuit modules are electrically connected to the input circuit module.

Advantageous Effects of Invention

According to the invention, it is possible to achieve a miniaturization and a low cost of a power conversion device.

DESCRIPTION OF EMBODIMENTS

Hereinafter, embodiments of a power conversion device according to the invention will be described with reference to the drawings. In the following, the description will be given about a DC-DC converter which includes a high-voltage primary circuit which converts a high DC voltage into an AC voltage, a transformer which converts a high AC voltage into a low AC voltage, and a low-voltage secondary circuit which converts a low AC voltage into a DC voltage. Further, the same components in the respective drawings will be denoted with the same symbols, and the redundant description will be omitted.

Figure 5:
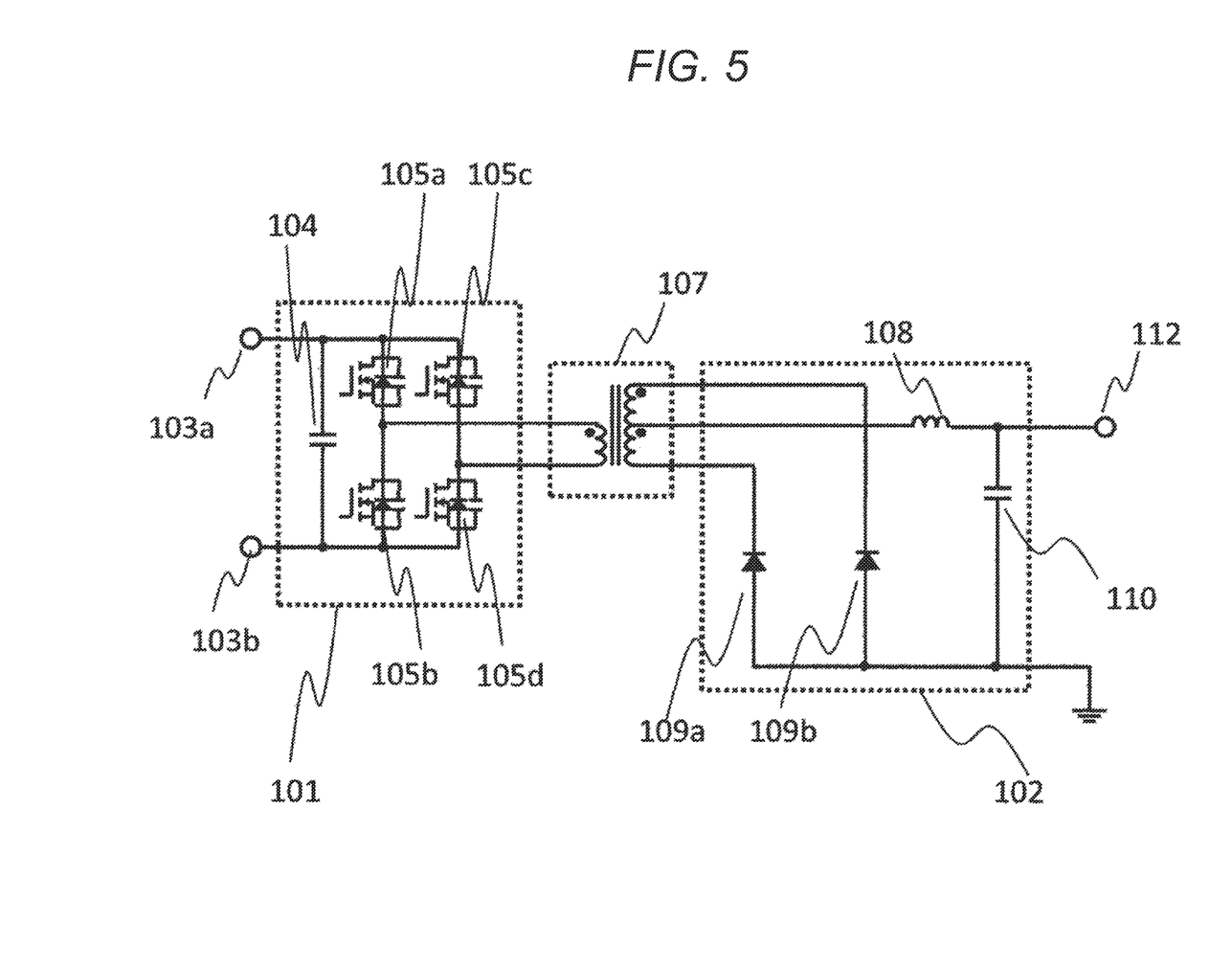
FIG. 5 is a diagram illustrating a circuit configuration of a conventional DC-DC converter.

A typical main circuit configuration of the DC-DC converter is illustrated in FIG. 5. The DC-DC converter includes high voltage terminals 103a and 103b and a low voltage terminal 112. As a high-voltage primary circuit 101, there is illustrated a circuit configuration in which four MOSFETs 105a to 105d are connected in an H bridge shape and a smoothing capacitor 104 is connected in the input side. A primary winding of a transformer 107 is connected to the output line. A center tap type transformer is employed as the transformer 107 in which a center point of the secondary winding is led out. A smoothing circuit made of a chock coil 108 and a capacitor 110 is connected to a rectifying circuit which is configured using diodes 109a and 109b or a MOSFET as a low voltage circuit.

An output current obtained by the DC-DC converter for a vehicle reaches even 200 A. Therefore, heat amounts of the secondary winding and the secondary circuit of the transformer are large, and thus it is difficult to achieve a miniaturization and a low cost due to a countermeasure against the temperature rise. Therefore, there is a conventional technique employing a configuration of a parallel DC-DC converter in which the secondary circuits are manufactured in a module type, and provided in parallel to share the output current and make the heat amount dispersed.

However, there are two problems in the configuration as follows. First, the transformer rises in temperature. The heat amount of the transformer itself is not changed only by arranging secondary circuit modules in parallel. Therefore, there is a need to increase a diameter of the winding to reduce a copper loss or to increase a cross-sectional area of a core to reduce an iron loss, which causes an increase in size of the transformer and the costs up.

Second, if there is a difference in inductance between the transformer and the wiring connecting the respective secondary circuit modules, the current may be not equally shared to the respective secondary circuit modules. If the inductance of the wirings connecting the transformer and the respective secondary circuit modules can be made equally, such a problem does not occur. However, the design may be difficult in many cases due to magnetic interference of each wiring and a layout restriction of the housing inside. In a case where the respective secondary circuit modules are unbalanced in current, there is a need to design a sufficient margin for heat of the components used inside the secondary circuit module, which causes an increase in size of the component and the costs up. Therefore, a conventional parallel configuration fails in miniaturization of the DC-DC converter and the costs down.

Figure 1:
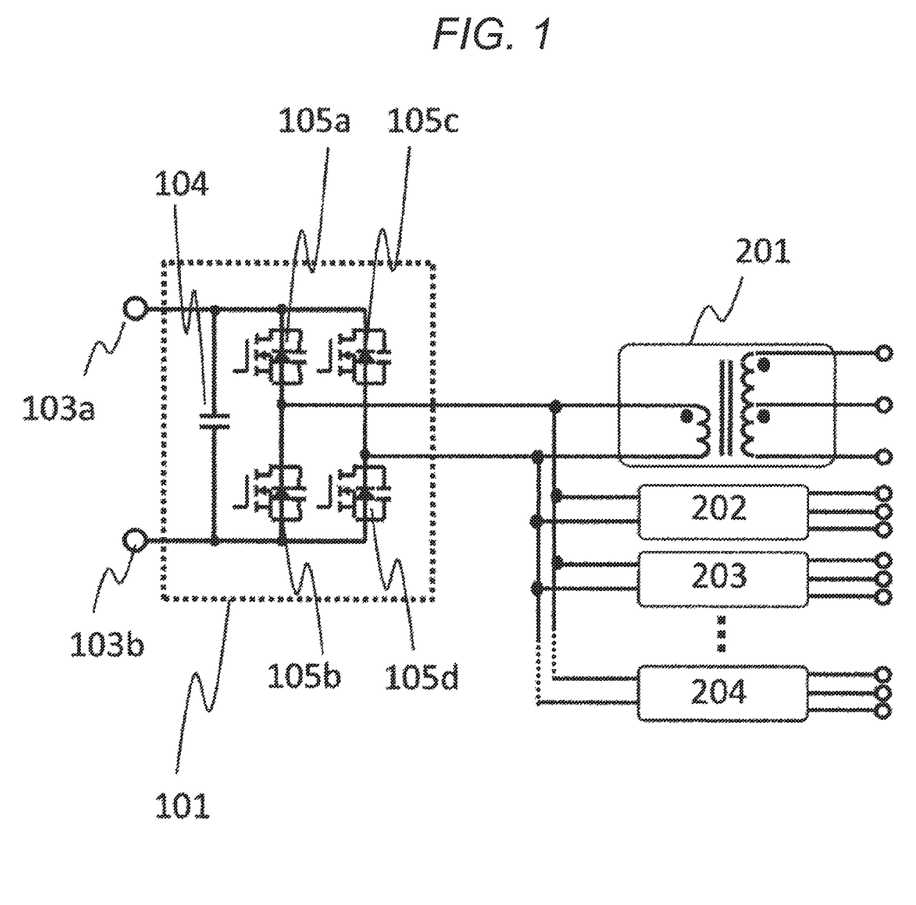
FIG. 1 is a diagram illustrating a circuit configuration of a DC-DC converter of the invention.

FIG. 1 is a diagram illustrating a circuit configuration of the DC-DC converter in this embodiment. As a high-voltage primary circuit 101, there is illustrated a circuit configuration in which four MOSFETs 105a to 105d are connected in an H bridge shape and the smoothing capacitor 104 is connected in the input side. The primary windings of a plurality of transformer 201 to 204 are connected to the output line of the primary circuit 101 in parallel. While not illustrated in the drawing, the transformers 202 to 204 mean the same transformer as the transformer 201. These transformers each are provided with a core around which the winding is wound, and the transformers are magnetically connected. Therefore, these transformers can be freely divided and disposed in separate places. In addition, since the plurality of transformers having the same configuration are connected, the current is divided into the respective transformers, and the power is transferred and shared onto the secondary side. Similarly, losses such as a copper loss caused by a winding resistance and an iron loss of the core may also be shared onto the respective transformers.

A principle of suppressing the temperature rise using a plurality of transformers connected in parallel and the reason of a miniaturization and the low cost will be described below.

A volume of a single type of transformer in the related art is represented by "V", and the heat amount is represented by "Q". In addition, assuming that the transformer is a cube shape, the length of one side is L(1) and a cross-sectional area of the transformer facing a converter housing is S(1). There is provided a water channel through which a coolant flows to the converter housing. A thermal resistance from the transformer to the coolant is set to Rt-w(1). A thermal resistance Rt-w(1) from the center of the transformer to the coolant is proportional to a height L(1) of the transformer, and inversely proportional to a cross-sectional area S(1). When a thermal conductivity of the transformer is set to "A", the following Expression (1) is obtained.

[Expression 1]

$$R_{t-w}(1) = \frac{L(1)}{A \times S(1)} \quad (1)$$

On the other hand, in a case where the number of transformers provided in parallel is set to "N" in a multiple parallel scheme, and the area of the transformer per each one is assumed as V/N, the length L(N) of one side of the transformer is represented by the following Expression (2).

[Expression 2]

$$L(N)=L(1)/N^{1/3} \quad (2)$$

In addition, the cross-sectional area S(N) of the transformer facing the housing is represented by Expression (3).

[Expression 3]

$$S(N)=S(1)/N^{2/3} \quad (3)$$

In a case where the thermal conductivity A of the transformer is constant regardless of the volume of the transformer, a thermal resistance Rt-w(N) from N transformers provided in parallel to the coolant becomes the following Expression (4).

[Expression 4]

$$R_{t-w}(N) = \frac{L(N)}{A \times S(N)} = \frac{L(1)}{A \times S(1)} \times N^{\frac{1}{3}} = R_{t-w}(1) \times N^{\frac{1}{3}} \quad (4)$$

Therefore, a temperature rise ΔT(N) from the water channel to the center of the transformer is represented by the following Expression (5) on the basis of the heat amount Q/N and the above expression, so that it can be seen that the temperature rise is suppressed by increasing the number (N) provided in parallel.

[Expression 5]

$$\Delta T(N) = Q/N \times R_{t-w}(1) \times N^{\frac{1}{3}} = \frac{\Delta T(1)}{N^{\frac{2}{3}}} \quad (5)$$

As described above, since the temperature rise of the transformer can be suppressed by increasing the number of transformers provided in parallel. Therefore, a heat dissipation member such as a potting resin, a heat dissipation sheet, and a thermal grease can be reduced so as to lower the cost. In addition, the number of windings or the diameter of the winding of the transformer may be designed small in order to leave a thermal margin in each transformer. In some cases, a general compact transformer or a compact core may be utilized, so that the cost can be lowered further more.

Figure 2:
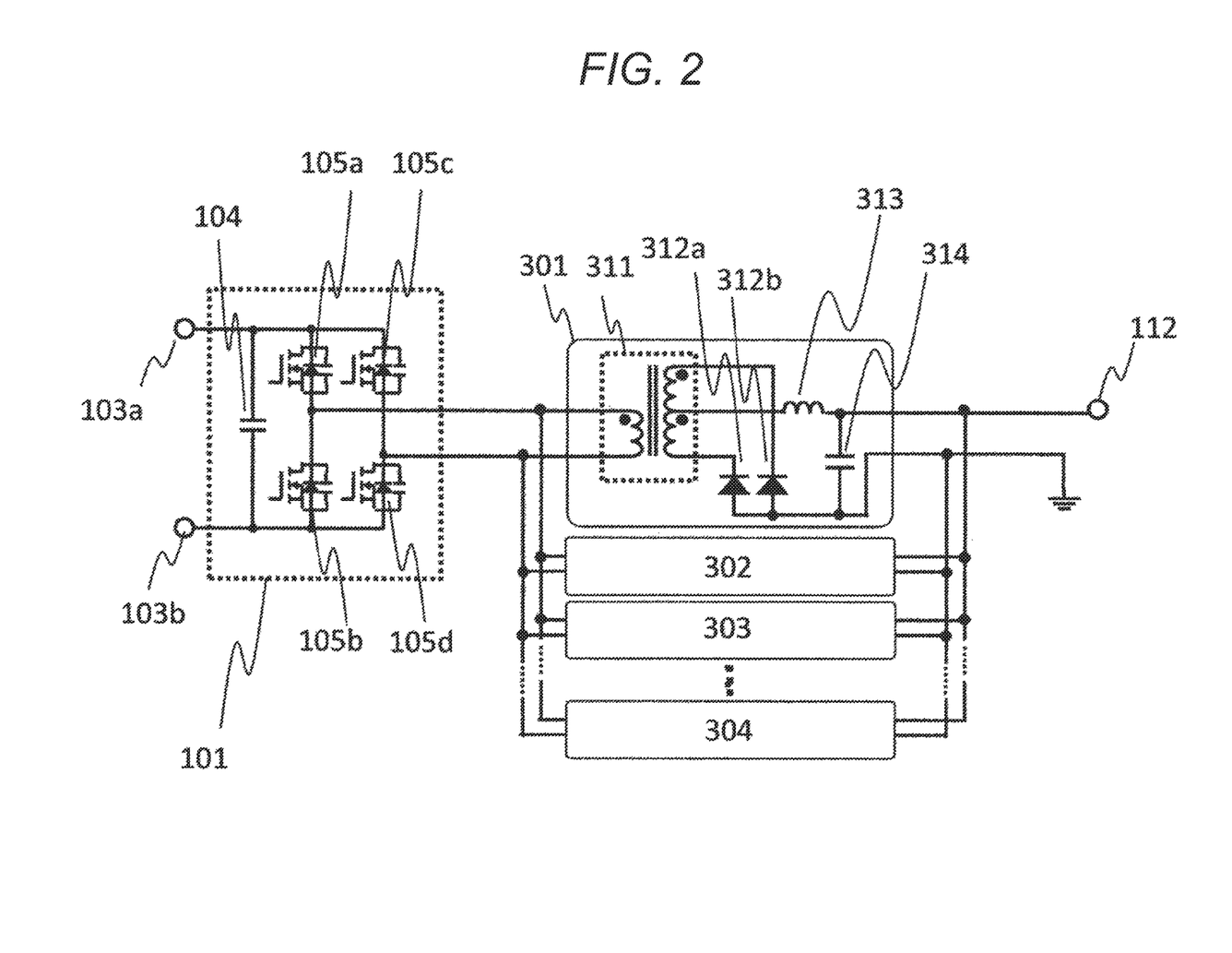
FIG. 2 is a diagram illustrating a circuit configuration of the DC-DC converter of the invention.

Next, FIG. 2 illustrates a circuit configuration in which the transformer and the low-voltage secondary circuit are provided in parallel. The high-voltage primary circuit 101 of the circuit configuration illustrated in FIG. 2 has the similar configuration to the high-voltage circuit 101 illustrated in FIG. 1. In the embodiment illustrated in FIG. 2, output circuit blocks 301 to 304 are connected to the output line of the primary circuit 101 in parallel. Herein, the circuit blocks 302 to 304 are configured by the same component as that of the circuit block 301 while not denoted in the drawing.

The output circuit block 301 is configured by a transformer 311, rectifier diodes 312a and 312b, a chock coil 313, and a smoothing capacitor 314. The inputs and the outputs of the output circuit blocks 301 to 304 are connected to the other circuit blocks in parallel.

In a conventional configuration of a parallel DC-DC converter, for example, in a configuration in which a single transformer is provided and only the secondary circuits are connected in parallel, there is a need to match the wiring inductance from the transformer to a rectifier element in the secondary circuits in order to remove the current unbalance between the secondary circuits. However, it is difficult to make the wiring length equal due to a restriction on the layout in many cases. In addition, it is difficult to design the inductance to be exactly equal due to magnetic interference with respect to the other wirings.

On the other hand, the DC-DC converter illustrated in the embodiment of FIG. 2 can improve the flexibility in design of wirings between the element of the secondary circuit and the transformer and easily remove the inductance difference of the wirings by providing the transformer in each secondary circuit. Therefore, the current unbalance of the respective secondary circuits can be removed, which contributes to a miniaturization and a low cost of the DC-DC converter.

Figure 3A:
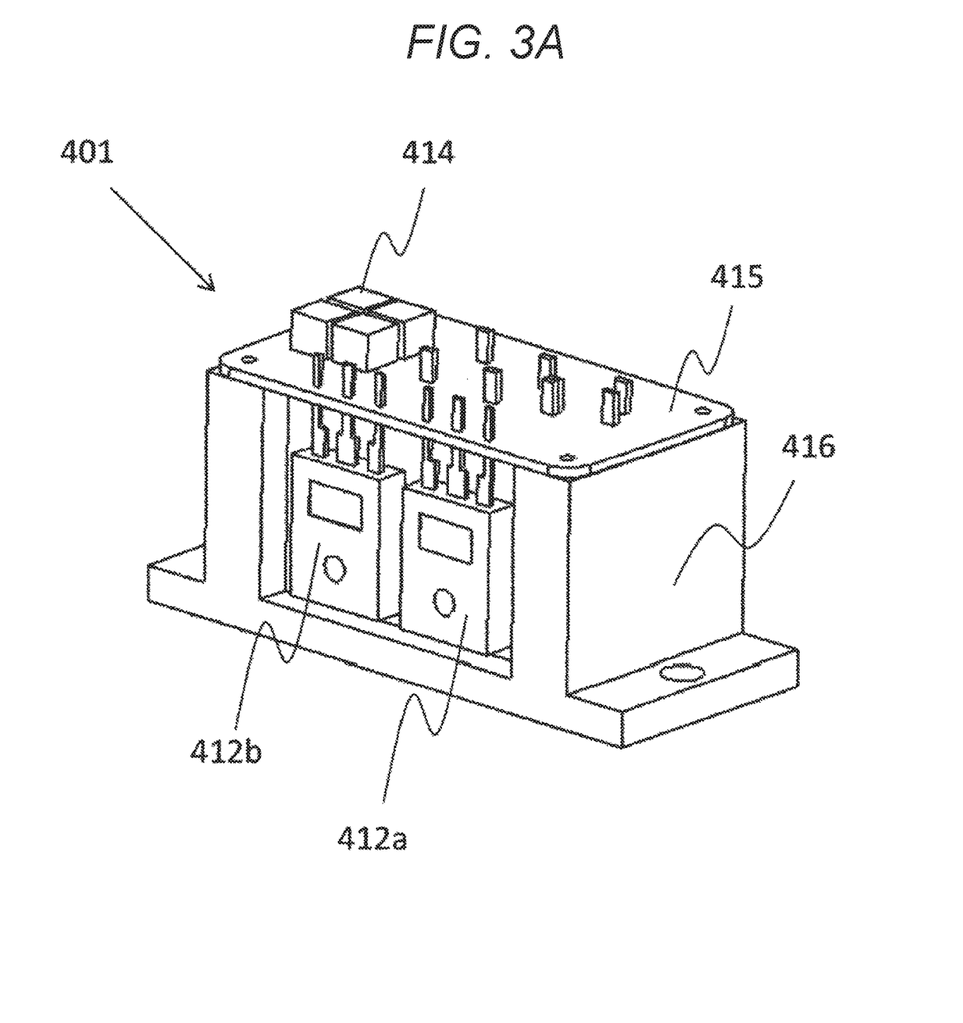
FIG. 3A is a perspective exterior view of a module which is used in the DC-DC converter of the invention.
Figure 3B:
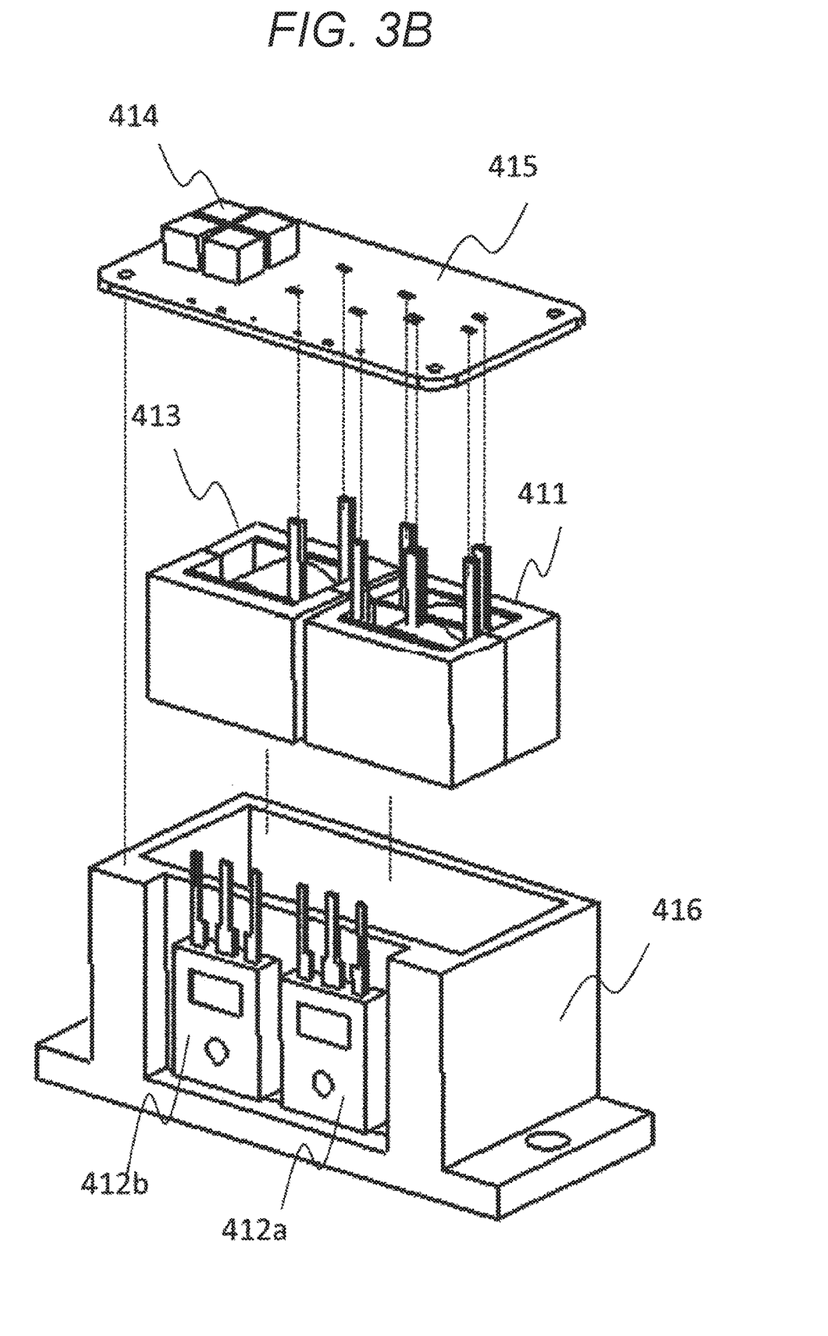
FIG. 3B is a bird's eye view of the module which is used in the DC-DC converter of the invention.

FIG. 3 is an example of a module mounting structure for realizing the circuit block 301 illustrated in FIG. 2. FIG. 3(a) is a perspective exterior view of a module 401, and FIG. 3(b) is an exploded perspective view of the module 401.

A transformer 411 and a chock coil 413, which are magnetic components among the components of the circuit block 301, are stored in a module case 416 which is designed for the purpose of component support and heat radiation. While not illustrated in the drawing, the case may be filled with a potting resin or the like in order to increase a radiation performance of the transformer 411 and the chock coil 413.

Rectifier diodes 412a and 412b are attached to the side wall surface of the module case 416. While not illustrated in the drawing, a heat dissipation sheet or the like may be interposed between the rectifier diodes 412a and 412b and the side wall surface of the module case 416 for the insulation and the heat radiation.

Respective connection terminals of the transformer 411, the chock coil 413, and the rectifier diodes 412a and 412b are connected to a circuit board 415 provided on the module case 416 using solder to sure electrical connection. In addition, some of components of the circuit block 301 which are small and can be mounted on the surface, for example, a capacitor 414, are mounted on the circuit board 415. As described above, the respective components are disposed, and the components are electrically connected by a wiring pattern provided in the circuit board 415, so that the circuit configuration of the circuit block 301 can be realized.

If the mounting structure of the module 401 is applied to the entire circuit block as a mounting structure to realize the circuit blocks 301 to 304 illustrated in FIG. 2, most the current unbalance between the respective modules disappears.

There is a need to design a variation in the wiring inductance between the transformer and the rectifier diode to be in a several nH order or less to suppress the current unbalance between the respective circuit blocks. The connection between the transformer and the rectifier diode in the module 401 is formed by the wiring pattern on the circuit board 415. Therefore, the wiring pattern may be similarly applied to the respective circuit blocks. In other words, if the mounting structure of the module 401 is commonly used in the respective circuit blocks, the wiring pattern is also automatically shared. Therefore, most the current unbalance disappears.

As described above, if the current unbalance between the respective modules is removed, there is no need to take the current unbalance into consideration for the margin of the thermal design. Therefore, it is possible to use smaller components as the components used in the module.

Figure 4:
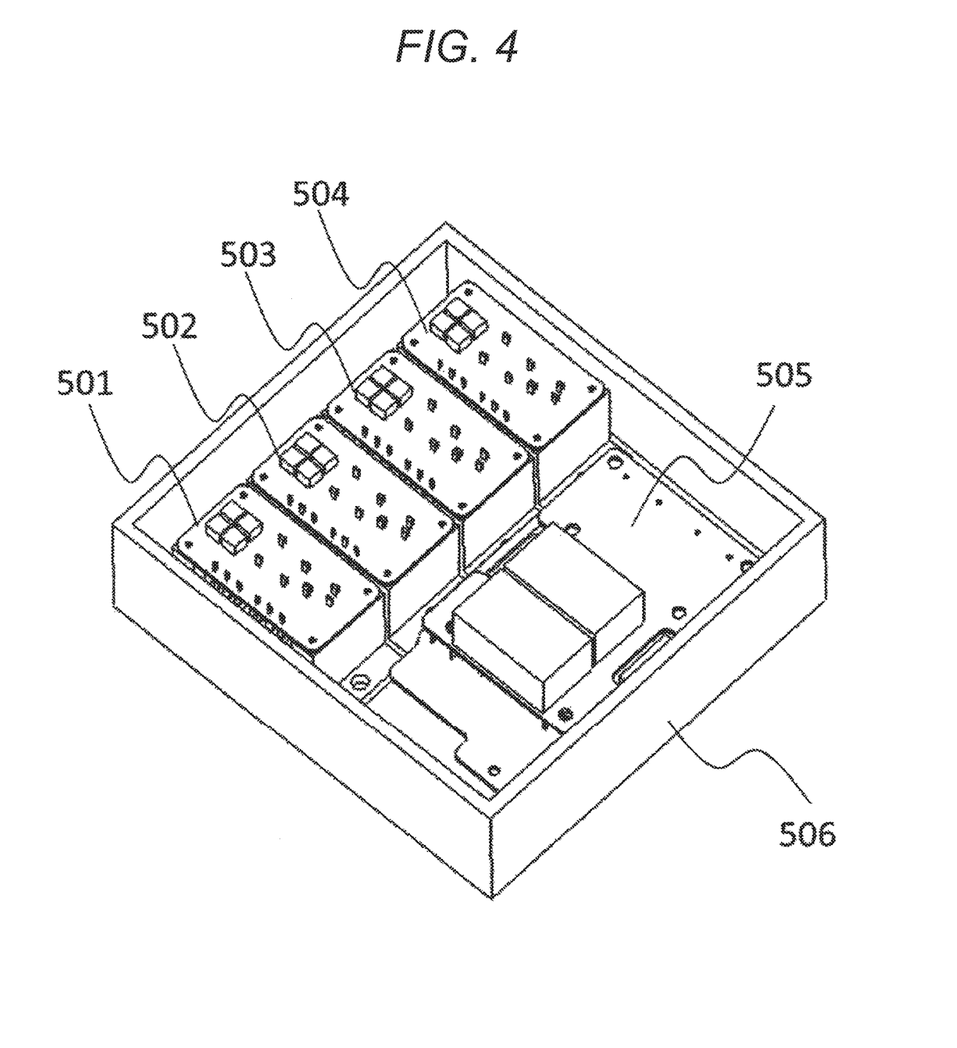
FIG. 4 is a diagram illustrating a mounting configuration of the DC-DC converter of the invention.

FIG. 4 illustrates an example of the mounting structure in a case where a plurality of modules 401 described using FIG. 3 is used to form the DC-DC converter. Modules 501 to 504 are those which employ the similar mounting structure to the module 401 in FIG. 3.

Each module is electrically connected to a primary circuit module 505, and forms the circuit illustrated in FIG. 2. The module case of each module is attached to a DC-DC converter housing 506 formed with a coolant channel using screws so as to secure a cooling performance.

In the structure illustrated in FIG. 4, a variation in the wiring inductance which causes a difference of a wiring length easily occurs in a wiring for connecting the respective modules 501 to 504 and the primary circuit module 505. However, in a case where a winding ratio N1/N2 of a primary winding N1 and the secondary winding N2 of the transformer is large, the variation in the wiring inductance of the primary winding does not cause an actual problem. The reason is that, in a case where the winding ratio N1/N2 is large, a leakage inductance of the transformer is larger than the wiring inductance in the primary side of the transformer, and the influence of the wiring becomes small. In the case of the DC-DC converter for a vehicle, the winding ratio N1/N2 is normally about "10", and the primary leakage inductance of the transformer 1 is about several uH. On the contrary, the wiring inductance is in a several nH order, and is sufficiently smaller than the primary leakage inductance of the transformer. Therefore, the DC-DC converter of the invention can be said as a configuration which is applied to a vehicle.

In addition, the above-described modules 501 to 504 are designed to have almost the same structure, so that the shapes and the dimensions of the respective components are almost the same. As described above, the connection wiring between the transformer and the rectifier diode is formed to be almost the same shape with respect to the respective modules. In addition, besides the connection wiring between the transformer and the rectifier diode, the connection wiring between the rectifier diode and the capacitor element and the connection wiring between the rectifier diode and the chock coil are also formed to have almost the same shape with respect to the respective modules.

Further, the expression "almost the same shape" described in this embodiment means a shape which is formed to have the same shape in terms of design idea, but does not intend a difference in shape caused by a variation in a dimensional tolerance or a manufacturing process. In other words, the invention is intended to easily equalize a variation in the wiring inductance caused by a layout of the components between modules, but it is not considered to make the wiring inductance between the modules exactly same.

REFERENCE SIGNS LIST 101 high-voltage primary circuit
102 low-voltage secondary circuit
103a, 103b high-voltage input terminal
104 smoothing capacitor
105a, 105b, 105c, 105d MOSFET
107 transformer
108 chock coil
109a, 109b rectifier diode
110 smoothing capacitor
112 low-voltage output terminal
201, 202, 203, 204 transformer
301 circuit block
311 transformer
312a, 312b rectifier diode (rectifier element)
313 chock coil (coil element)
314 capacitor (capacitor element)

401 module (output circuit module)
411 transformer
412a, 412b rectifier diode (rectifier element)
413 chock coil (coil element)
414 capacitor (capacitor element)
415 circuit board
416 module case
501, 502, 503, 504 module (output circuit module)
505 high-voltage primary circuit
506 housing

The invention claimed is:

1. A power conversion device which boosts down and output an input voltage, the power conversion device comprising:
an input circuit which includes a switching element; and
an output circuit module which includes a transformer and a rectifier element,
wherein a plurality of the output circuit modules are provided,
wherein the plurality of output circuit modules are electrically connected to the input circuit,
wherein the transformer includes a primary winding which is connected to the input circuit and a secondary winding which is connected to the rectifier element, and
wherein the number of windings of the primary winding is larger than that of the secondary winding,
wherein the output circuit module includes a first output circuit module and a second output circuit module,
wherein the first output circuit module includes a first transformer, a first rectifier element, and a first connection wiring which connects the first transformer and the first rectifier element,
wherein the second output circuit module includes a second transformer, a second rectifier element, and a second connection wiring which connects the second transformer and the second rectifier element,
wherein the first connection wiring is formed to have almost the same shape as the second connection wiring,
wherein the first output circuit module includes a first metal case unit in which the first transformer is stored,
wherein the second output circuit module includes a second metal case unit in which the second transformer is stored,
wherein the first rectifier element is disposed on a side wall surface of the first metal case unit, and
wherein the second rectifier element is disposed on a side wall surface of the second metal case unit.

2. The power conversion device according to claim 1,
wherein the first output circuit module includes a first circuit board in which the first connection wiring is mounted,
wherein the second output circuit module includes a second circuit board in which the second connection wiring is mounted,
wherein the first transformer and the first rectifier element are connected to the first circuit board, and
wherein the second transformer and the second rectifier element are connected to the second circuit board.

3. The power conversion device according to claim 1,
wherein the first output circuit module includes a first capacitor element and a third connection wiring which connects the first rectifier element and the first capacitor element,
wherein the second output circuit module includes a second capacitor element and a fourth connection wiring which connects the second rectifier element and the second capacitor element, and
wherein the third connection wiring is formed to have almost the same shape as the fourth connection wiring.

4. The power conversion device according to claim 1,
wherein the first output circuit module includes a first coil element and a fifth connection wiring which connects the first rectifier element and the first coil element,
wherein the second output circuit module includes a second coil element and a sixth connection wiring which connects the second rectifier element and the second coil element, and
wherein the fifth connection wiring is formed to have almost the same shape as the sixth connection wiring.

5. A power conversion device which boosts down and output an input voltage, the power conversion device comprising:
an input circuit which includes a switching element; and
an output circuit module which includes a transformer and a rectifier element,
wherein a plurality of the output circuit modules are provided,
wherein the plurality of output circuit modules are electrically connected to the input circuit,
wherein the output circuit module includes a first output circuit module and a second output circuit module,
wherein the first output circuit module includes a first transformer, a first rectifier element, and a first connection wiring which connects the first transformer and the first rectifier element,
wherein the second output circuit module includes a second transformer, a second rectifier element, and a second connection wiring which connects the second transformer and the second rectifier element,
wherein the first connection wiring is formed to have almost the same shape as the second connection wiring,
wherein the first output circuit module includes a first metal case unit in which the first transformer is stored,
wherein the second output circuit module includes a second metal case unit in which the second transformer is stored,
wherein the first rectifier element is disposed on a side wall surface of the first metal case unit, and
wherein the second rectifier element is disposed on a side wall surface of the second metal case unit.

6. A power conversion device which boosts down and output an input voltage, the power conversion device comprising:
an input circuit which includes a switching element; and
an output circuit module which includes a transformer and a rectifier element,
wherein a plurality of the output circuit modules are provided,
wherein the plurality of output circuit modules are electrically connected to the input circuit,
wherein the output circuit module includes a first output circuit module and a second output circuit module,
wherein the first output circuit module includes a first transformer, a first rectifier element, a first coil element, and a fifth connection wiring which connects the first rectifier element and the first coil element,
wherein the second output circuit module includes a second transformer, a second rectifier element, a second coil element, and a sixth connection wiring which connects the second rectifier element and the second coil element, wherein the fifth connection wiring is formed to have almost the same shape as the sixth connection wiring,
wherein the first metal case unit and the second metal case unit are filled with a resin,
wherein the first rectifier element is disposed on a side wall surface of the first metal case unit, and
wherein the second rectifier element is disposed on a side wall surface of the second metal case unit.

* * * * *